(12) United States Patent
Kim (10) Patent No.: US 6,306,672 B1
(45) Date of Patent: Oct. 23, 2001

(54) GROUP III-V COMPLEX VERTICAL CAVITY SURFACE EMITTING LASER DIODE AND METHOD FOR MANUFACTURING THE SAME

(75) Inventor: Taek Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/121,311

(22) Filed: Jul. 23, 1998

(30) Foreign Application Priority Data

Jul. 24, 1997 (KR) .................................. 97-34653

(51) Int. Cl.[7] .................................................. H07L 21/00
(52) U.S. Cl. ................................ 438/22; 438/37; 438/46
(58) Field of Search .......................... 438/22, 47, 37, 438/46, 983, 979, 29

(56) References Cited

U.S. PATENT DOCUMENTS 5,739,945 * 4/1998 Tayebati ................................. 359/291
5,757,837 * 5/1998 Lim et al. ............................... 372/50
5,838,707 * 11/1998 Ramdani et al. ...................... 372/45
5,977,612 * 11/1999 Bour et al. ............................ 257/618

* cited by examiner

Primary Examiner—Vu A. Le
Assistant Examiner—Bradley K Smith
(74) Attorney, Agent, or Firm—Burns, Doane, Swecker & Mathis, LLP

(57) ABSTRACT

A Group III-V complex vertical cavity surface emitting laser (VCSEL) diode manufactured using GaN-system III-V nitride, and a method of manufacturing the same, are provided. The Group III-V complex surface emitting laser diode can obtain a sufficient reflectance even with a small number of pairs of a distributed bragg reflector (DBR), by forming DBRs including air layers. Thus, the crystal growth problem is solved. Also, current confinement and waveguiding are realized by AlN lateral oxidation or etching.

25 Claims, 12 Drawing Sheets

GROUP III-V COMPLEX VERTICAL CAVITY SURFACE EMITTING LASER DIODE AND METHOD FOR MANUFACTURING THE SAME

BACKGROUND OF THE INVENTION

1. Field of the Invention

The present invention relates to a Group III-V complex vertical cavity surface emitting laser (hereinafter refer to VCSEL) diode manufactured using GaN-system III-V nitride and a manufacturing method thereof.

2. Description of the Related Art

In general, a VCSEL manufactured of GaN-system III-V nitride can emit near ultraviolet light of 400 nm wavelength and blue light, so it can be used in a high-capacity information storage apparatus. Also, the surface emitting laser oscillates in a single longitudinal mode as opposed to an edge emitting laser.

Figure 1:
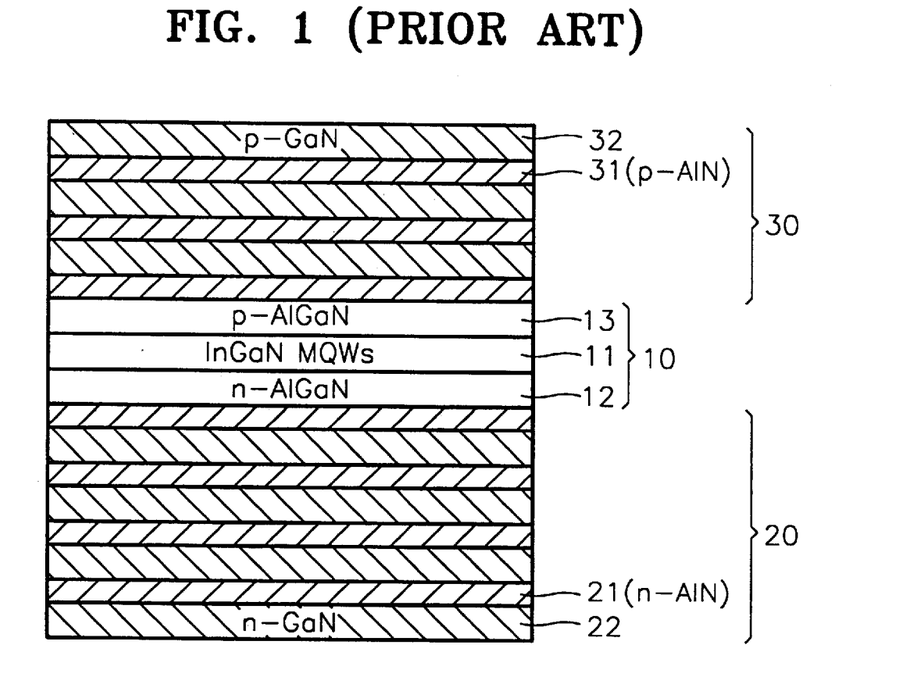
FIG. 1 is a vertical cross-section of a conventional VCSEL diode having distributed bragg reflectors (DBRs) formed of GaN/AlN multi layers.

Such a surface emitting laser diode, as shown in FIG. 1, usually includes a cavity 10 and Distributed Bragg Reflectors DBR 20 and 30 of reflectance of 99.9% or greater, respectively provided on the lower and upper surfaces of the cavity 10. The cavity 10 has an active layer 11 formed of InGaN multi quantum wells, and n-AlGaN and p-AlGaN carrier restrictive layers 12 and 13 respectively formed on the lower and upper surfaces of the active layer 11. The DBRs are generally one of two types. One type uses semiconductor materials which have similar lattice constants and are capable of epitaxial growth, such as GaAs and AlAs, and the other type uses a dielectric material such as $SiO_2$, $Al_2O_3$, $TiO_2$, or $ZnO_2$. In the former case, current can be injected via semiconductor, and the quality of the thin film is excellent. Here, a usable DBR has a greater bandgap energy than that of a light of wavelength self-stimulating in the active layer 11, and the self-stimulating light must not be absorbed in the DBR. It is preferable that the difference in the refractive index between two layered OBR materials is great. In the GaN-system VSCEL diode as shown in FIG. 1, the DBRs 20 and 30 can be formed of a semiconductor material such as alternating layers of GaN 22 and 32 and AlN or AlGaN 21 and 31. Among them, AlGaN and AlN 21 and 31, containing at least 30% Al, have significantly high bandgap energy. Accordingly, when current is injected via the DBRs composed of the AlGaN and AlN 21 and 31, a voltage for driving them significantly increases, so that problems due to generation of heat may be created. Furthermore, when the DBR is comprised of the GaN 22 and 32 and AlN 21 and 31 having the greatest difference in refractive index, at least 20 pairs of layers must be stacked to obtain a desired high reflectance. Furthermore, a very narrow wavelength width in a high reflectance region makes it difficult to design a VSCEL diode. A slight deviation from the thickness of the cavity 10 or a small change in the composition of the active layer 11 can ruin self-stimulating conditions.

Figure 2A:
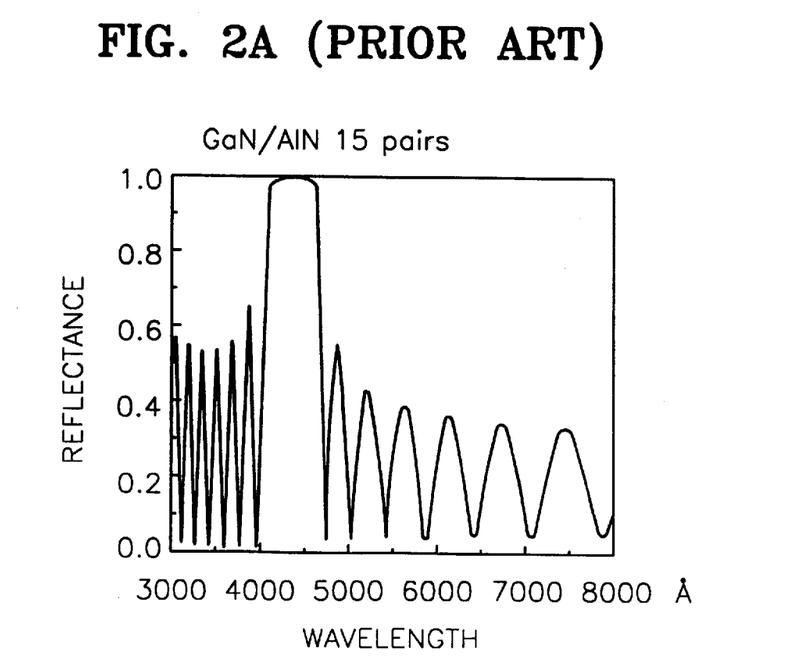
FIG. 2A is a graph illustrating reflectance of a DBR in the VCSEL diode of FIG. 1 having a DBR formed of GaN/AlN 1-pair multilayers.
Figure 2B:
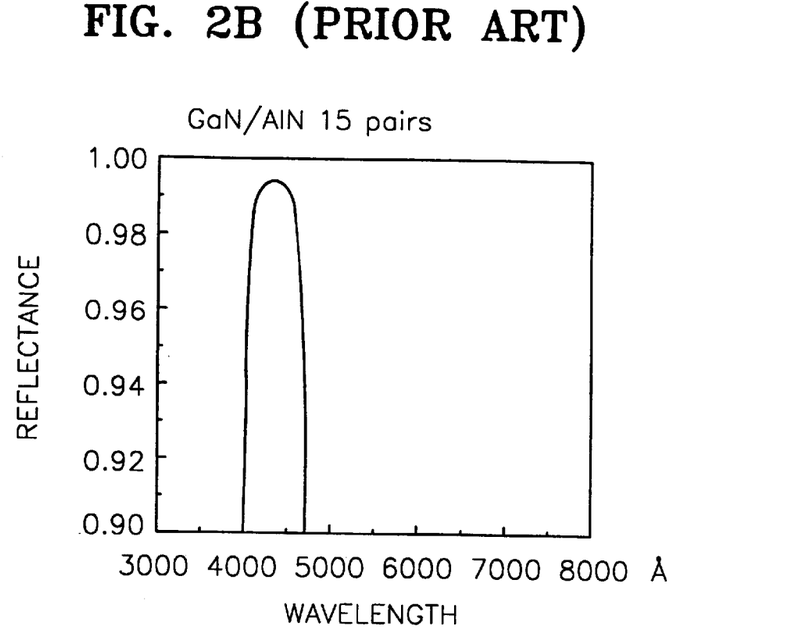
FIG. 2B is an enlarged graph illustrating reflectance between 0.9 and 1 of the reflectance graph of FIG. 2A.
Figure 3A:
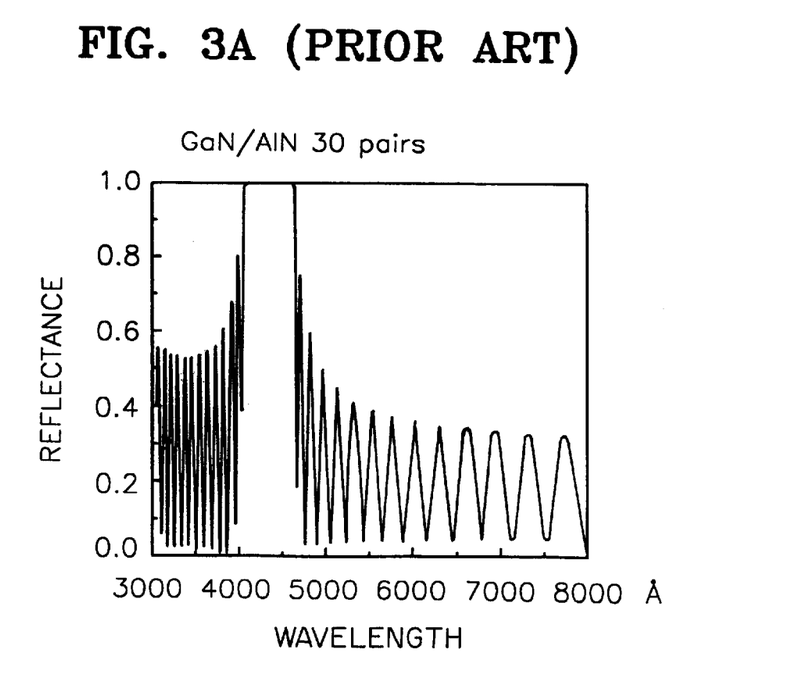
FIG. 3A is a graph illustrating reflectance of a DBR in the surface emitting laser diode of FIG. 1 having a DBR formed of GaN/AlN 30-pair multilayers.
Figure 3B:
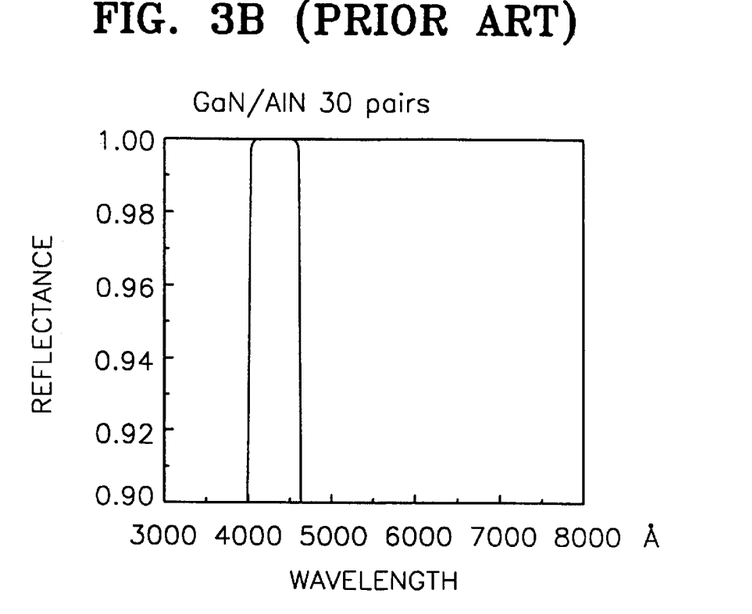
FIG. 3B is an enlarged graph illustrating reflectance between 0.9 and 1 of the reflectance graph of FIG. 3A.

FIGS. 2A and 3A show reflectance of DBRs formed by stacking GaN and AlN with a thickness of $\lambda/4n$ ($\lambda$ is a wavelength, and n is refractive index) to 15 pairs and to 30 pairs, respectively. Here, the refractive indices of GaN and layers are set to 2.67 and 2.15, respectively, and a central wavelength is set to 430 nm. From FIG. 2B being an extended graph of FIG. 2A, we can see that sufficient reflectance cannot be obtained by the 15-pair DBR and that the width of a spectrum indicating high reflectance is very narrow. From FIG. 3B being an extended graph of FIG. 3A, we can recognize that sufficient reflectance can be obtained by the 30-pair DBR but that the width of the spectrum indicating high reflectance is still too narrow. However, a more serious technical problem is that manufacture of the DBR with so many pairs is difficult due to slow and difficult crystal growth of GaN/AlN in contrast with the DBR manufactured of GaAs/AlAs.

A dielectric DBR can be utilized in order to overcome such defects, but it can be applied to only an upper DBR. A lower DBR must be manufactured by the crystal growth method in order to grow the cavity.

SUMMARY OF THE INVENTION

To solve the above problems, it is an objective of the present invention to provide a vertical cavity surface emitting laser (VCSEL) diode comprising a DBR having a high reflectance by growing a small number of layers using a crystal growth technique, and a manufacturing method thereof.

Accordingly, to achieve the above objective, there is provided a Group III-V complex vertical cavity surface emitting laser (VCSEL) diode including a lower distributed bragg reflector (DBR), a cavity and an upper DBR, wherein each of the lower and upper DBRs is formed by stacking pairs of a relatively high refractive index GaN layer and a relatively low refractive index air layer to 2 or more (e.g., 3 to 15) pairs of stacked layers, each layer having a thickness of $\lambda/4n$, when $\lambda$ is the wavelength of produced light and n is the refractive index of a DBR constituent material.

In the Group III-V complex VCSEL diode, the lower and upper DBRs are comprised of pairs of an air layer and an AlGaN layer having Al of a predetermined amount or less. The cavity comprises: an active layer formed of InGaN multi quantum wells; and an n-AlGaN first carrier restrictive layer and a p-AlGaN second carrier restrictive layer, formed respectively on the lower and upper surfaces of the active layer, for restricting carriers. The cavity further comprises a first n-GaN contact layer and a second p-GaN contact layer for connecting electrodes, formed on one surface of the first n-AlGaN carrier restrictive layer and one surface of the second pAlGaN carrier restrictive layer, respectively. The cavity further comprises an n-AlN layer formed as a current passage in the mid portion of the n-AlGaN first carrier restrictive layer or the first n-GaN contact layer, and a current blocking layer formed of oxidized n-AlN or air in the vicinity of the n-AlN layer, or further comprises a p-AlN layer formed as a current passage in the mid portion of the second p-AlGaN carrier restrictive layer or the first p-GaN contact layer, and a current blocking layer formed of oxidized p-AlN or air in the vicinity of the p-AlN layer.

An electrode is formed on the upper edges of the first n-GaN contact layer and second pGaN contact layer, to be isolated from the upper DBR and the cavity. It is preferable that the lower DBR layer, the cavity and the upper DBR layer are formed in the shape of a cylinder having a large diameter in the stacking sequence, and supporters for supporting the cylindrical lower DBR layer, cavity layer and upper DBR layer are formed on the outer side of the cylindrical structure in a body of each layer.

To achieve the above objective, there is also provided a method of manufacturing a Group III-V complex surface emitting laser diode, comprising the steps of: (a) sequentially growing a preliminary lower DBR layer, a preliminary cavity layer and a preliminary upper DBR layer on a semiconductor substrate and patterning the preliminary upper DBR layer using a first dry etch method; (b) forming an upper DBR layer by removing an AlN layer from the patterned preliminary upper DBR layer using a selective wet etch method and forming an air layer having a relatively low refractive index; (c) forming a cavity by etching the The step of forming a buffer layer by growing AlN or GaN directly on the semiconductor substrate using metal organic chemical vapor deposition (MOCVD) or molecular beam epitaxy (MBE) is further comprised before the step (a), In the step (a), when λ is the wavelength of light and n is the refractive index of a constituent material of a DBR, the upper and lower DBR layers are formed by alternately stacking GaN and AlN, or AlGaN with a relatively small amount of Al and AlGaN with a relatively great amount of Al, each of the four materials having a thickness of λ/4n. Pairs of GaN and AlN, or pairs of AlGaN with a relatively small amount of Al and AlGaN with a relatively great amount of Al, are stacked to 2 or more (e.g., 3 to 15) pairs of stacked layers. In the step (a), forming the preliminary cavity layer comprises the substeps of forming an n-AlGaN carrier restrictive layer for restricting carriers, on the preliminary lower DBR layer; forming an active layer having a multi quantum well structure, of InGaN or GaN, on the n-AlGaN carrier restrictive layer; and forming a p-AlGaN carrier restrictive layer for restricting carriers, on the active layer, and further comprises the step of: forming n-GaN and p-GaN contact layers for metal contact on the lower surface of the n-AlGaN carrier restrictive layer and on the upper surface of the p-AlGaN carrier restrictive layer, respectively. The step of forming the n-AlGaN carrier restrictive layer or the step of forming the n-GaN contact layer further comprises the step of forming an n-AlN layer during the formation of the n-AlGaN carrier restrictive layer or n-GaN contact layer. Or, the step of forming the p-AlGaN carrier restrictive layer or the step of forming the p-GaN contact layer further comprises the step of forming a p-AlN layer during the formation of the p-AlGaN carrier restrictive layer or p-GaN contact layer. A KOH solution is used as an etchant for the selective wet etch method in step (b). The step of forming a current blocking layer by oxidizing or etching some of the width of the n-AlN layer or p-AlN layer from its side surface is further comprised after the step (c). A KOH solution is used as an etchant for the selective wet etch method in step (e). The step of depositing a metal for use as an electrode on the edge upper surface of each of the n-GaN and p-GaN contact layers, is further comprised after the step (e).

Also, in the present invention, a pair of an $Al_xO_y$ layer and a GaN layer is stacked three to fifteen times to make each of the preliminary lower and upper DBR layers, in step (a), and the upper and lower DBRs each comprised of pairs of the GaN layer and an air layer are formed by removing the $Al_xO_y$ layer using the wet etch method, in steps (b) and (e), respectively. Or, a pair of a p-GaN layer and a n-GaN layer is stacked three to fifteen times to make each of the preliminary lower and upper DBRs, in step (a), and the upper and lower DBRs each comprised of pairs of the p-GaN layer and an air layer are formed by etching and removing only the n-GaN layer using a photoelectrochemical etch method, in steps (b) and (e), respectively.

BRIEF DESCRIPTION OF THE DRAWINGS

The above objective and advantages of the present invention will become more apparent by describing in detail preferred embodiments thereof with reference to the attached drawings in which.

DESCRIPTION OF THE PREFERRED EMBODIMENTS

A Group III-V complex VCSEL diode according to the present invention uses a new distributed bragg reflector (DBR) formed by alternating air layers with GaN layers or AlGaN layers containing a small amount of Al, in order to overcome an intrinsic restriction on crystal growth of GaN/AlN material and manufacture an excellent VCSEL.

Figure 4:
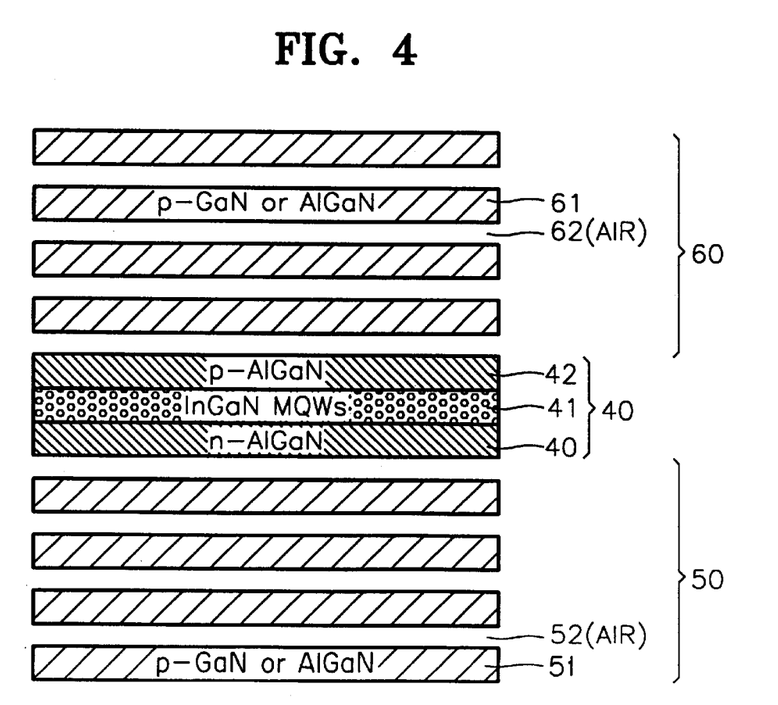
FIG. 4 is a vertical cross-section of a VCSEL diode according to the present invention.
Figure 5A:
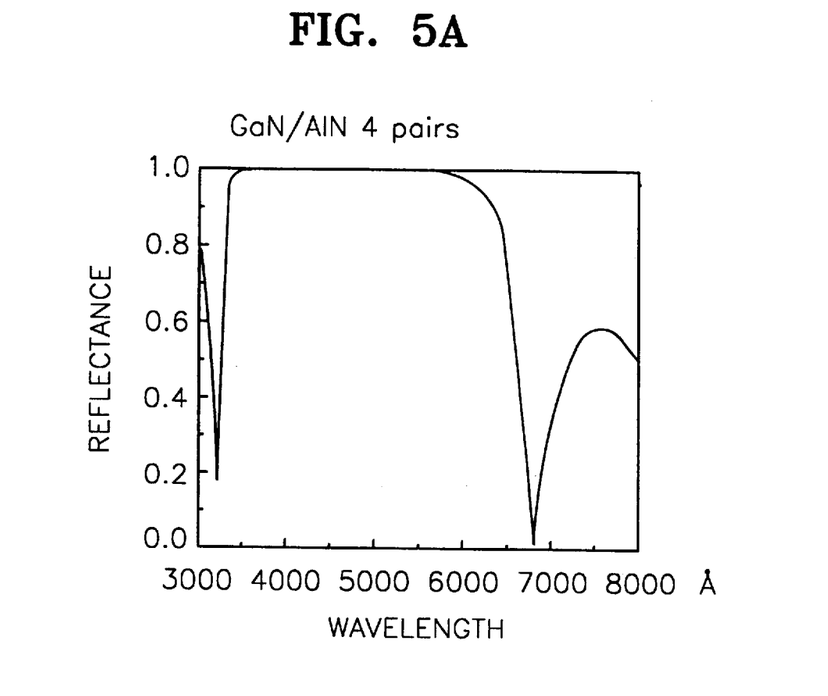
FIG. 5A is a graph illustrating reflectance of a DBR in the VCSEL diode of FIG. 4 having a DBR formed of GaN/Air 4-pair multilayers.
Figure 5B:
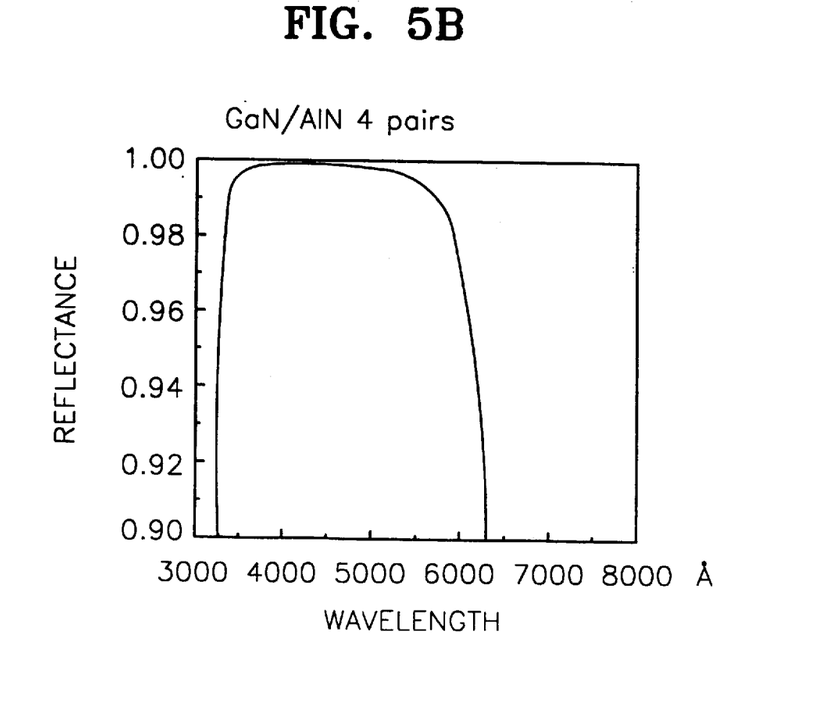
FIG. 5B is an enlarged graph illustrating reflectance between 0.9 and 1 of the reflectance graph of FIG. 5A.

As shown in FIG. 4, the Group III-V complex VCSEL diode basically includes a cavity 40 and upper and lower distributed bragg reflectors (DBRs) 50 and 60 formed respectively on the upper and lower surfaces of the cavity 40. The cavity 40 has an active layer 41 formed of InGaN multiquantum wells (MQWs), and p-AlGaN and n-AlGaN carrier restrictive layers 42 and 43 formed respectively on the upper and lower surfaces of the active layer 41. The upper and lower DBRs 50 and 60 are formed of GaN (or AlGaN with a small amount of Al) 51 and 61 alternating with air 52 and 62. Since the refractive index of air is 1, the DBRs 50 and 60 can obtain sufficiently high reflectance even with stacked layers of only at least two (e.g., 3 to 15) pairs, and a spectrum band indicating high reflectance is significantly wide. This is shown in a graph calculating the reflectance of a DBR with four pairs of alternating GaN layers and air layers as shown in FIGS. 5A and 5B. Here, FIG. 5B is a graph showing an enlargement of the Y axis of FIG. 5A between 0.9 and 1. The upper DBR 60 has an aperture of 10 μm or less to accomplish single mode operation.

Figure 6A:
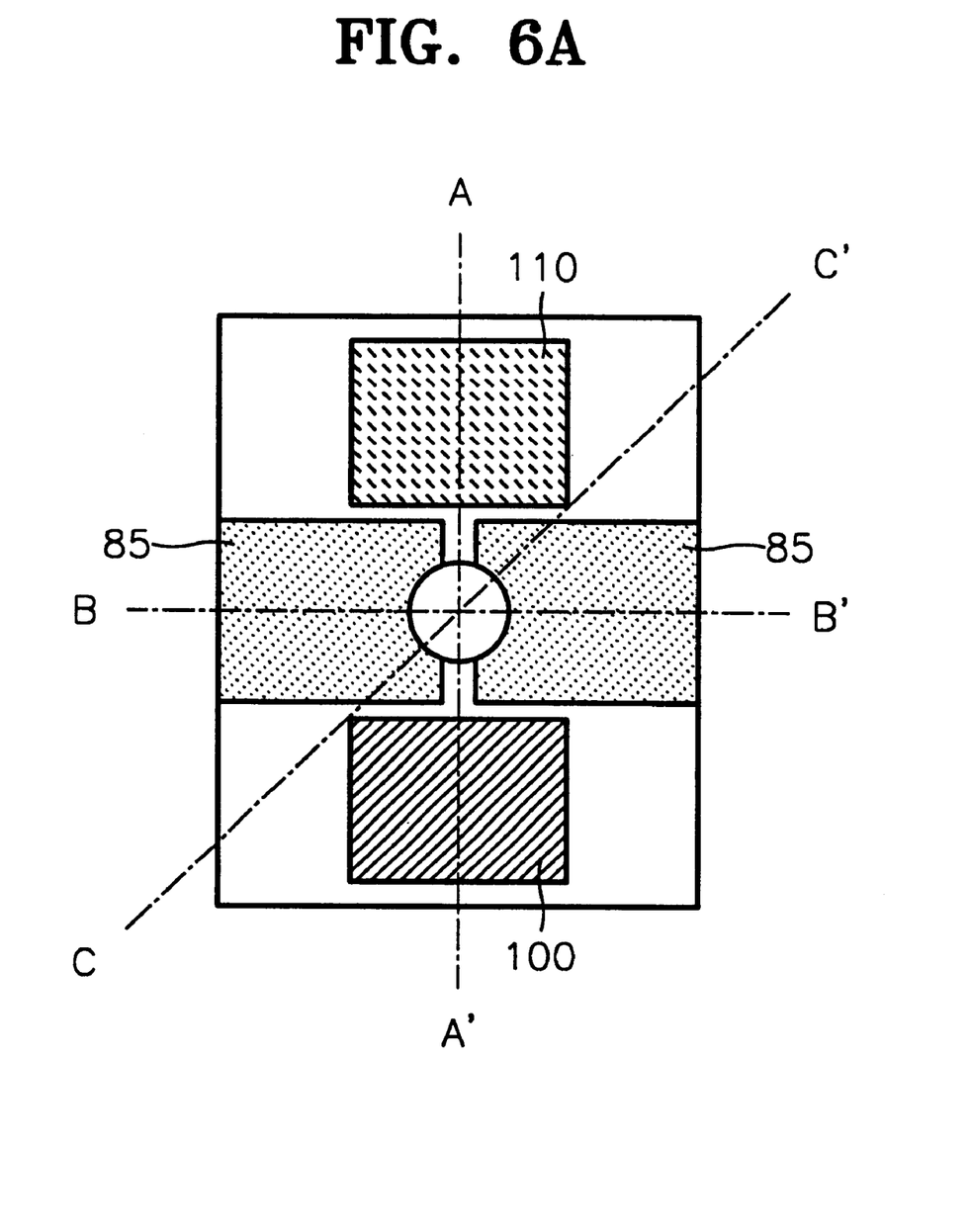
FIG. 6A is a plan view of a first embodiment to which the basic structure of the VCSEL diode of FIG. 4 is applied.
Figure 6B:
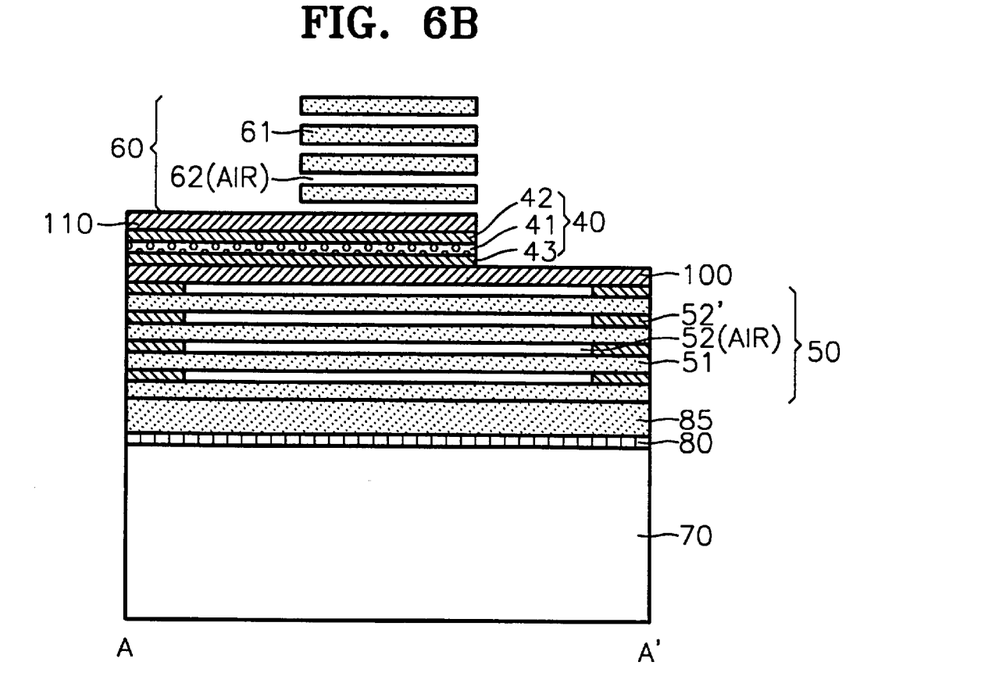
FIG. 6B is a vertical cross-section illustrating the first embodiment of FIG. 6A cut along line A–A'.
Figure 6C:
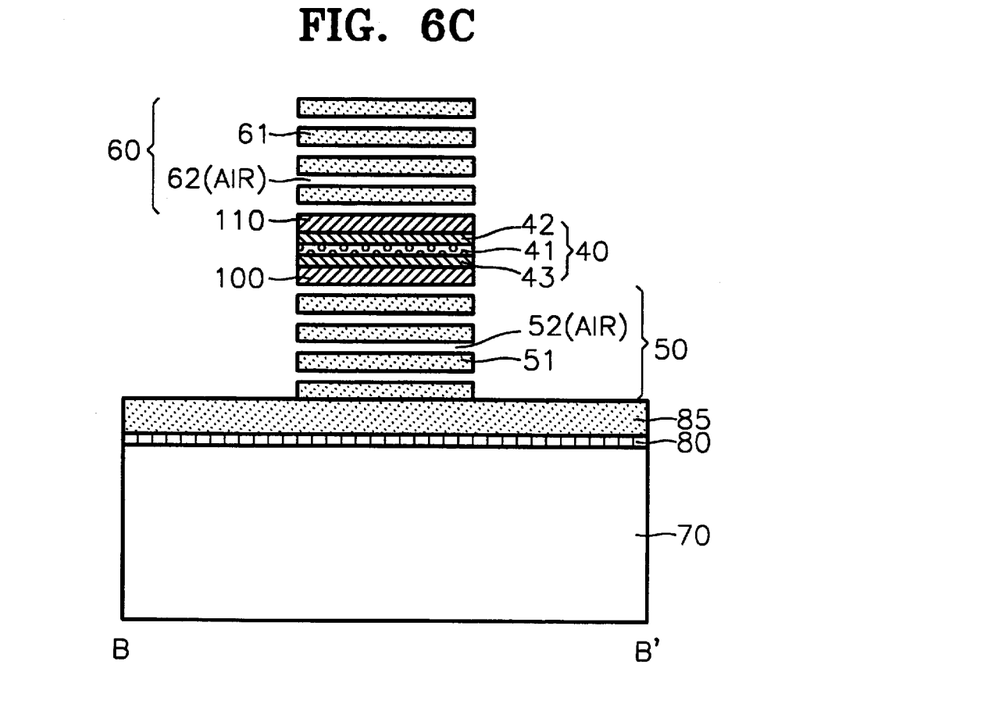
FIG. 6C is a vertical cross-section showing the first embodiment of FIG. 6A cut along line B–B'.
Figure 6D:
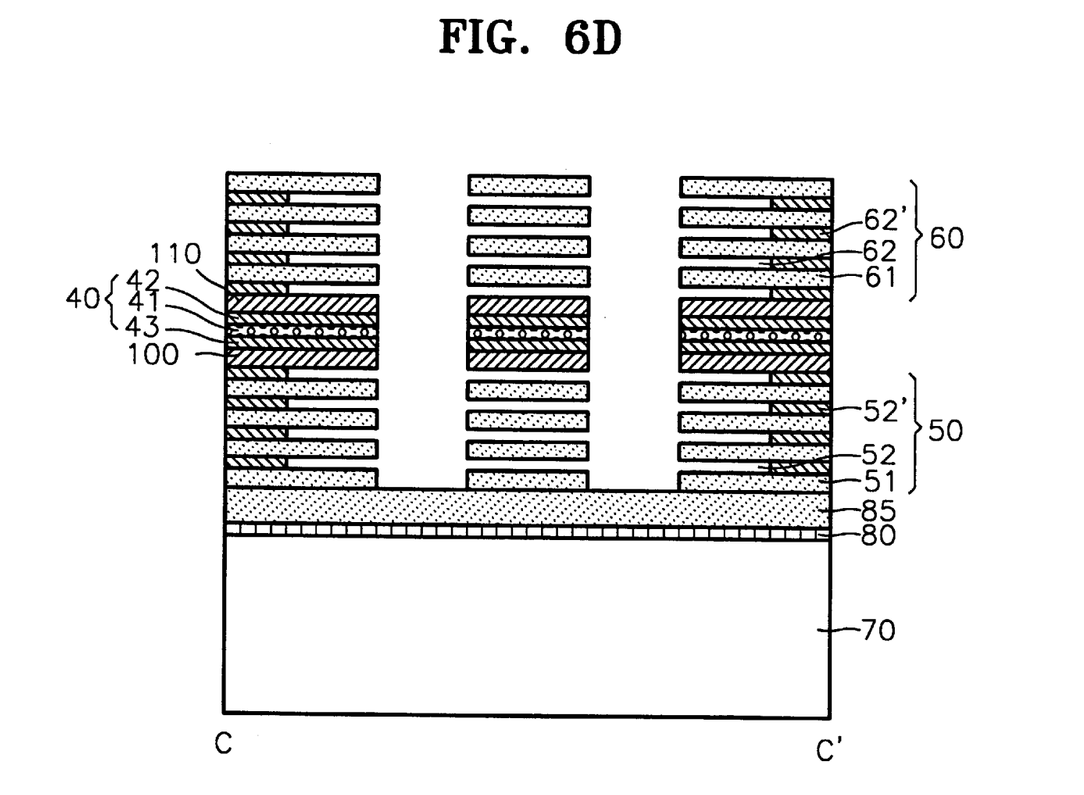
FIG. 6D is a vertical cross-section showing the first embodiment of FIG. 6A cut along line C–C'.

FIG. 6A shows a plan view of a first embodiment of the Group III-V complex VCSEL diode having such characteristics. FIGS. 6B, 6C and 6D are vertical cross-sections of the structure of FIG. 6A, cut along lines A–A', B–B' and C–C', respectively. As shown in the above drawings, the first embodiment has a basic structure of a cylinder shape formed by sequentially stacking a buffer layer 80, a GaN layer 85, a lower DBR 50, a n-GaN lower contact layer 100, a cavity 40, a p-GaN upper contact layer 110 and an upper DBR 60 on a substrate 70, and has a supporter for sustaining air layers in the upper and lower DBRs, in the vicinity of the basic structure. From FIGS. 6A, 6B and 6D, we can see how p-GaN layers 51 and 61 are fixed when air layers are formed (when conventional AlN layers are removed). That is, a material (AlGaN or n-GaN) which is etched to form air layers 52 and 62 is not completely etched, and remains at the edges to function as supporters 52' and 62', thus maintaining the air layers 52 and 62. Also, the cavity 40 is comprised of an n-AlGaN lower carrier restrictive layer 43, an InGaN active layer 41, and a p-AlGaN upper carrier restrictive layer 42. The cavity 40 intervenes between the n-GaN contact layer 100 and the p-GaN contact layer 110. Electrodes (not shown; refer to reference numerals 120 and 130 in FIG. 8G) are formed on the edges of the circular p-GaN and n-GaN contact layers 100 and 110.

Here, the n-GaN and p-GaN contact layers 100 and 110 can be formed as part of the cavity 40 or as the first high-refractive index layer of the DBR, depending on their thickness. That is, when the n-GaN and p-GaN contact layers 100 and 110 are formed as the first high-refractive index layer of the DBR, they are $\lambda/4n$ thick ($\lambda$ is a laser wavelength, and n is the refractive index of a medium). When they are formed as part of the cavity, they have a thickness which is appropriate for light waveguiding.

Figure 7A:
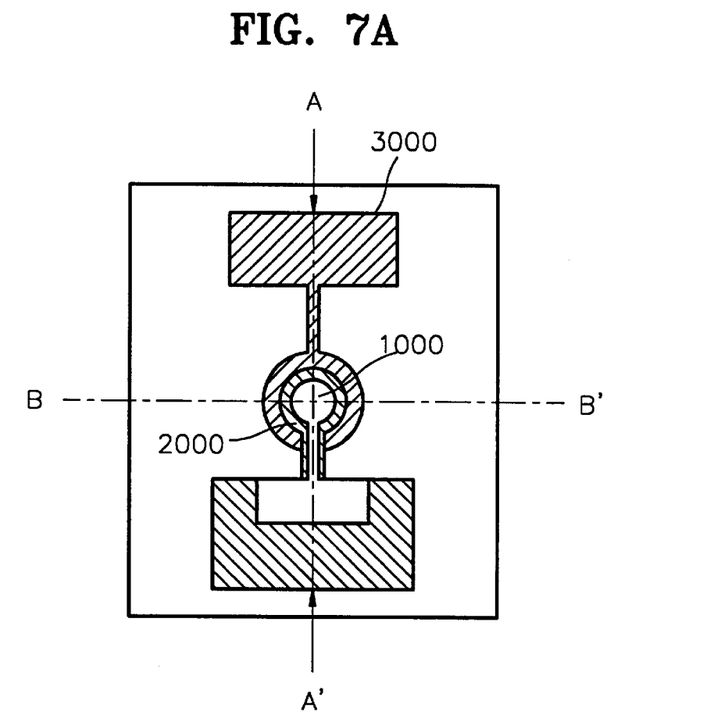
FIG. 7A is a plan view of a second embodiment to which the basic structure of the VCSEL diode of FIG. 4 is applied.
Figure 7B:
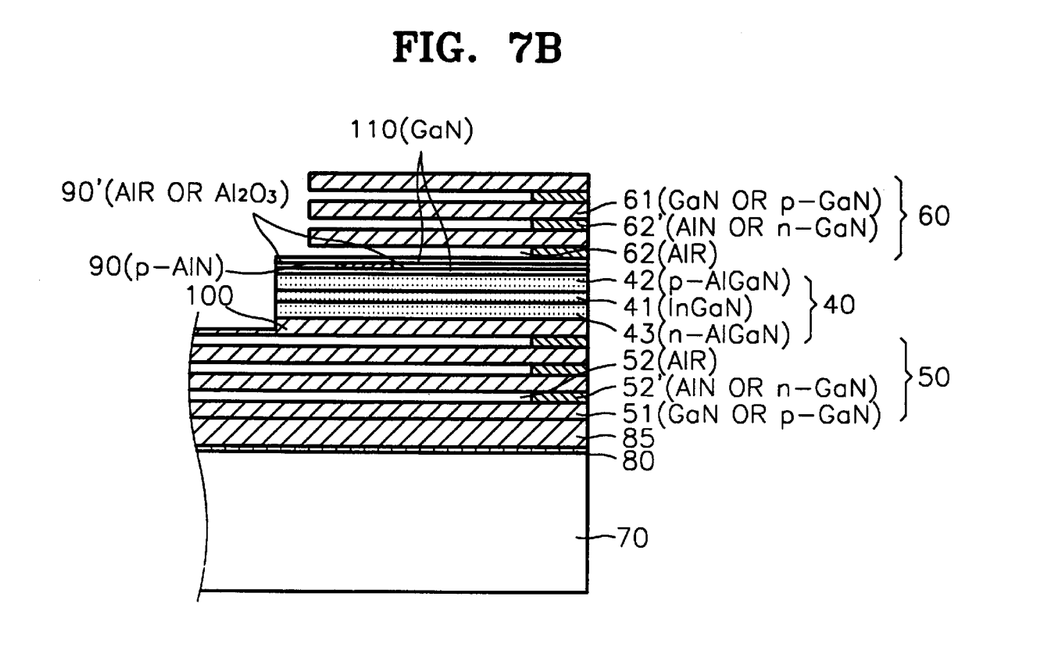
FIG. 7B is a vertical cross-section showing the second embodiment of FIG. 7A cut along line A–A'.
Figure 7C:
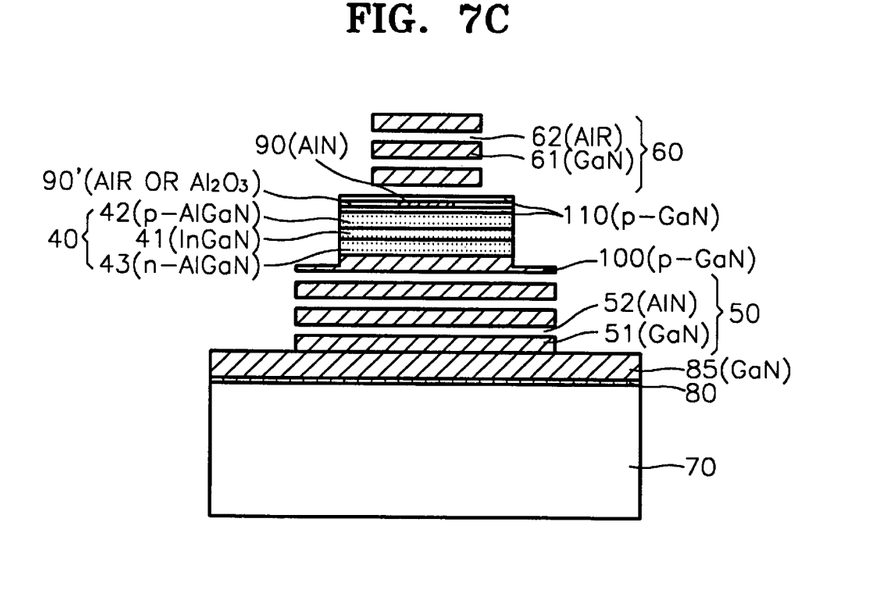
FIG. 7C is a vertical cross-section showing the second embodiment of FIG. 7A cut along line B–B'.

FIG. 7A is a plan view of a second embodiment of a Group III-V complex surface emitting laser diode according to the present invention. FIGS. 7B and 7C are vertical sections of the structure of FIG. 7A, cut along lines A–A' and B–B', respectively. As shown in the above drawings, the second embodiment has a basic structure of a cylinder shape formed by sequentially stacking a buffer layer 80, a GaN layer 85, a lower DBR 50, a n-GaN lower contact layer 100, a cavity 40, a p-GaN upper contact layer 110 and an upper DBR 60 on a substrate 70 like the first embodiment, and has a supporter for maintaining air layers in the upper and lower DBRs, in the vicinity of the basic structure. As shown in FIGS. 7A and 7B, when air layers 52 and 62 are formed (when conventional AlN layers are removed), a material (AlGaN or n-GaN) is etched to form the air layers 52 and 62 but not completely etched and remains at the edges to function as the supporters 52' and 62', so that the p-GaN layers 51 and 61 are fixed. Also, the cavity 40 is comprised of an n-AlGaN lower carrier restrictive layer 43, an InGaN active layer 41 and a p-AlGaN upper carrier restrictive layer 42. The cavity 40 intervenes between the n-GaN contact layer 100 and the p-GaN contact layer 110. Particularly, the second embodiment further comprises a p-AlN conductive channel 90 formed in the middle of the p-AlGaN upper carrier restrictive layer 42 or the p-AlN upper contact layer 110, for current confinement to the cavity 40, and a current blocking layer 90' formed of air or $Al_2O_3$ around the p-AlN conductive channel 90. In the drawings, the p-AlN conductive channel 90 and the air or $A'_2O_3$ current blocking layer 90' are formed inside the upper contact layer 110. Accordingly, when a voltage is applied between the electrodes (not shown; refer to reference numerals 120 and 130 of FIG. 8G) formed on the edges of the circular p-GaN and n-GaN contact layers 110 and 100, the current blocking layer 90' prevents a current from flowing into areas other than the conductive channel 90. The conductive channel 90 and the current blocking layer 90' may also be formed inside the n-AlGaN lower carrier restrictive layer 43 or n-GaN lower contact layer 100. Here, as in the first embodiment, the n-GaN and p-GaN contact layers 100 and 110 can be formed as part of the cavity 40 or as the first high refractive layer of the DBR.

A method of manufacturing the Group III-V complex VCSEL diode having such a structure will now be described based on the second embodiment, since although the structures are fundamentally the same, the second embodiment is more complicated than the first embodiment.

Figure 8A:
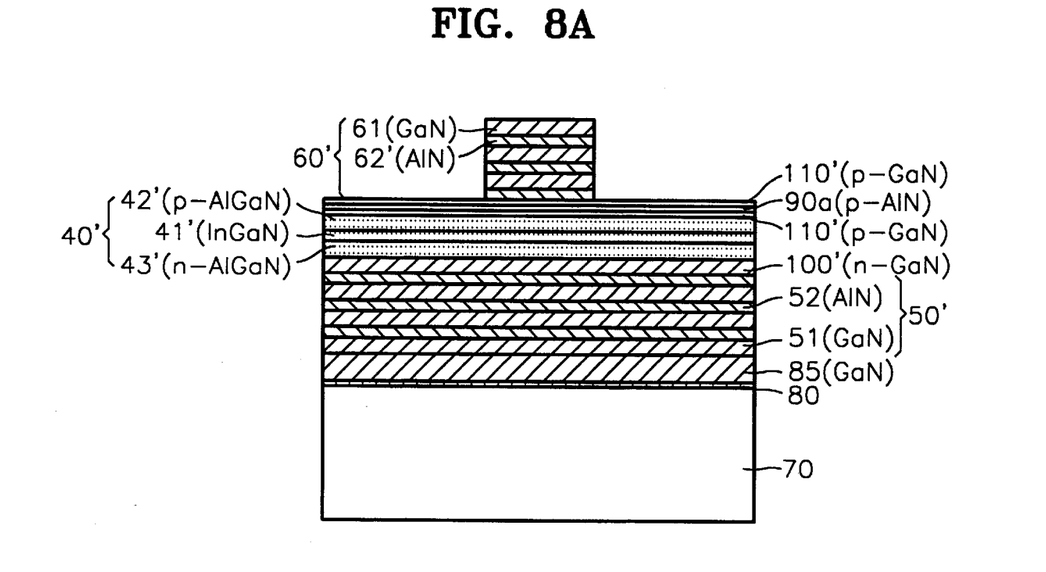
FIGS. 8A through 8G are cross-sectional views illustrating a process for manufacturing the second embodiment of FIGS. 7A through 7C.

As shown in FIG. 8A, after an AlN or GaN buffer layer 80 is grown on the substrate 70, a preliminary lower DBR 50', a preliminary lower contact layer 100', a preliminary cavity layer 40', a preliminary upper contact layer 110' and a preliminary upper DBR 60' are sequentially grown on the buffer layer 80. Next, the preliminary upper DBR layer 60' is patterned in the shape of a region 1000 of FIG. 7A by a first dry etching method. Metal organic chemical vapor deposition (MOCVD) or molecular beam epitaxy (MBE) is used as a crystal growth method when the preliminary upper DBR layer 60' is patterned. Here, a p-AlN layer 90a for use as a current passage is grown to be inserted in the upper contact layer 110'. The preliminary cavity layer 40' is grown in the sequence of a n-AlGaN preliminary lower carrier restrictive layer 43', an InGaN preliminary active layer 41' and a p-AlGaN preliminary upper carrier restrictive layer 42'. In particular, when a current blocking layer is formed in the preliminary upper carrier restrictive layer 42' instead of forming the p-AlN layer 90a for use as a current passage in the preliminary upper contact layer 110', the p-AlN layer 90a for use as the current passage may be grown to be inserted in the preliminary upper carrier restrictive 4 layer 42'. The preliminary upper and lower DBRs 50' and 60' are manufactured by alternating GaN or AlGaN with a small amount of Al, AlN or AlGaN with a great amount of Al, respectively, by a thickness of $\lambda/4n$ (A is a wavelength and n is a refractive index). Etch layers 52' and 62' of AlN or AlGaN with a great amount of Al are crystalgrown and then selectively removed by wet etching. As a result, air in the empty space becomes a low refractive index layer, and since the refractive index of the air is 1, the air layer is stacked to a thickness of $\lambda/4$. Here, the number of pairs must be adjusted appropriately in consideration of a desired reflectance. However, in general the desired reflectance is obtained by stacking at least two (e.g., 3 to 5) pairs of layers. In contrast with a conventional VCSEL diode based on GaAs, the Group III-V complex surface emitting laser diode according to the present invention does not need the DBR to be doped with n-type or p-type, since a current is not applied via the DBRs. The preliminary cavity 40' is comprised of a preliminary active layer 41' formed of multi quantum wells, and n-AlGaN and p-AlGaN carrier restrictive layers 43' and 42' stacked on the upper and lower surfaces of the preliminary active layer 41'.

Figure 8B:
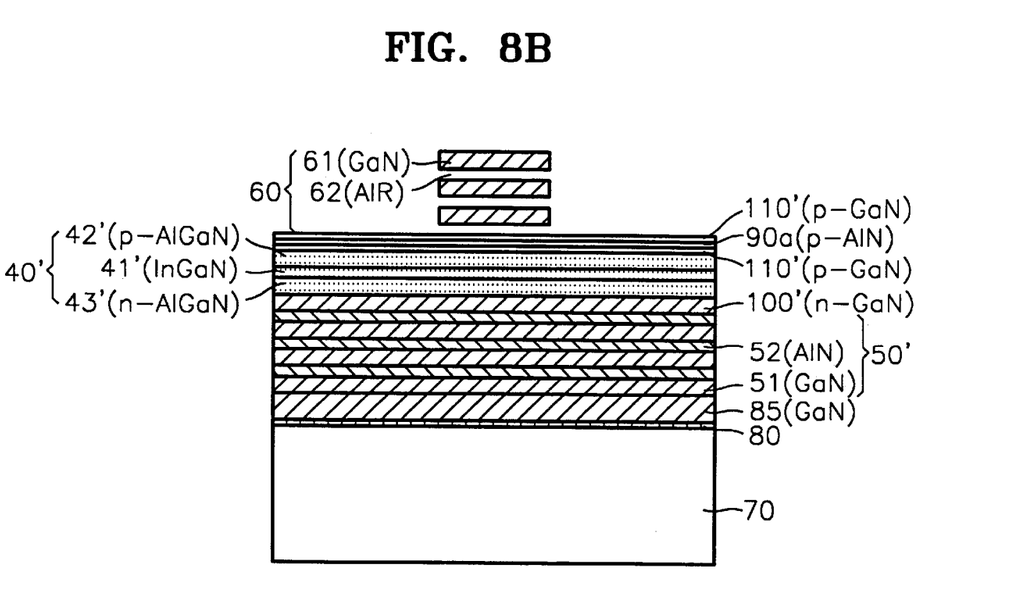

As shown in FIG. 8B, a low refractive index upper DBR layer 60 is formed by removing the AlN layer 62' from the upper DBR 60' using selective wet etching to form the air layer 62. Here, a KOH solution is used as an etchant.

Figure 8C:
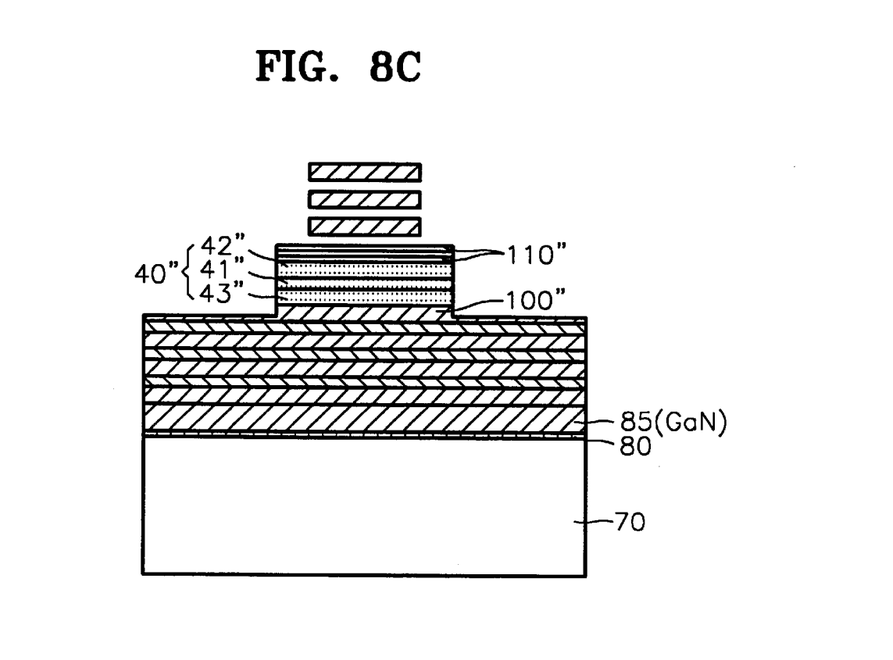

After an etch mask of a pattern like ' a region 2000 of FIG. 7A is formed, a pGaN upper contact layer 110', a cavity layer 40' and a part of a n-GaN lower contact layer 100' are etched by a second dry etching method as shown in FIG. 8C, to form a p-GaN upper contact layer 110", a cavity layer 40" and a n-GaN lower contact layer 100".

Figure 8D:
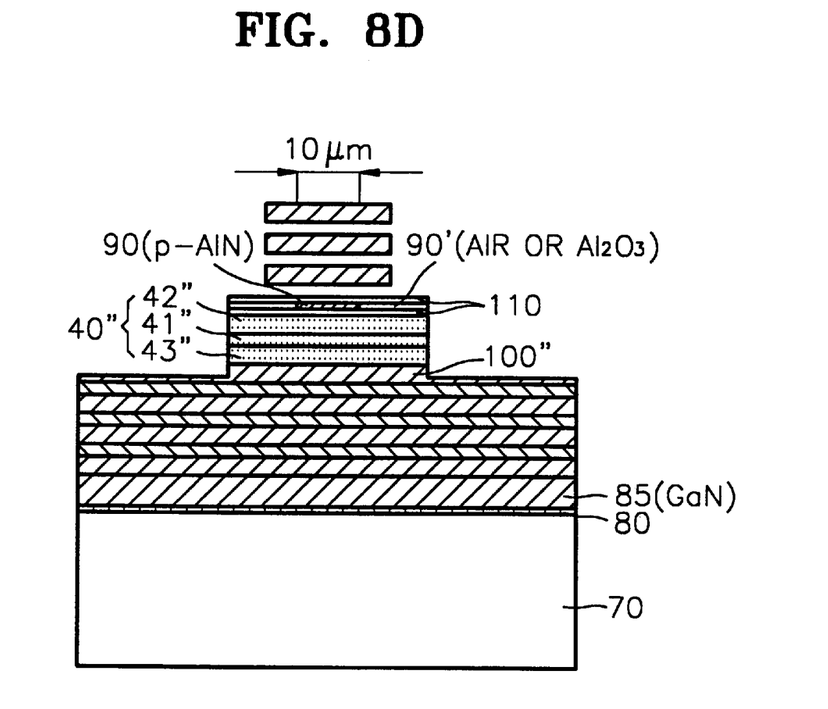

Under high temperature and an oxygen atmosphere, the p-AlN layer 90a in the p-GaN preliminary upper contact layer 110" is oxidized or etched from its exposed side surfaces to form a current blocking layer 90' as shown in FIG. 8D. On the contrary, the center portion of a circular pattern still retains the p-AlN, and is used as a current passage 90. A formed oxide film and air layer 90' waveguides a self-simulated beam to allow single longitudinal mode operation.

Figure 8E:
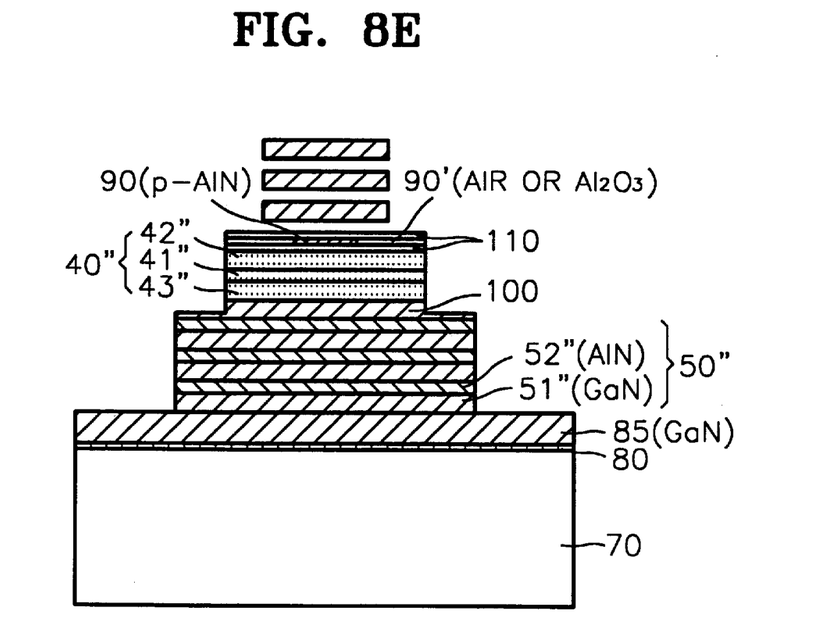

After a etch mask is formed in a pattern like a region 3000 of FIG. 7A, a part of an n-GaN lower contact layer 100" and a preliminary lower DBR layer 50' are dry-etched by a third dry etch method up to the upper surface of a GaN layer 85, to thus form a n-GaN lower contact layer 100 and a preliminary lower DBR layer 50" as shown in FIG. 8E.

Figure 8F:
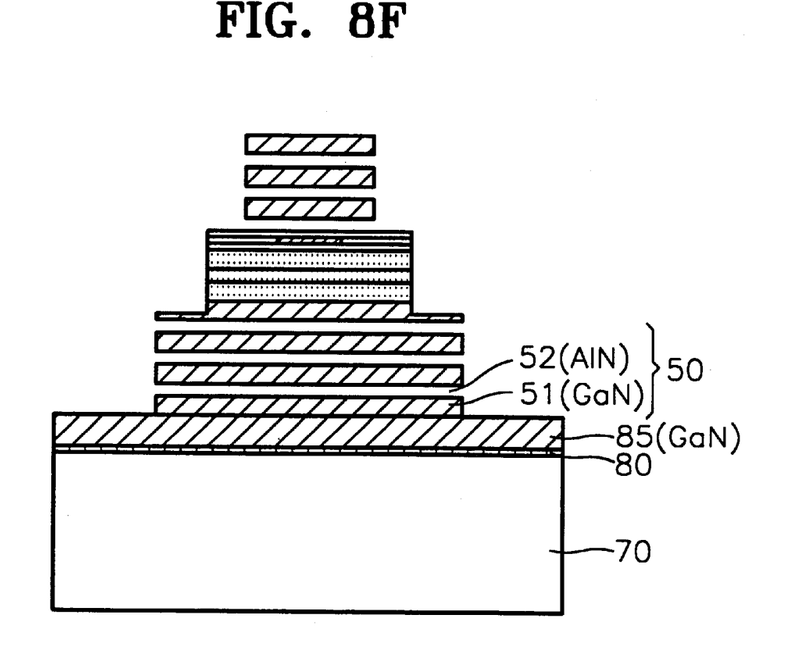

Next, an AlN layer 52" of the preliminary lower DBR layer 50" is removed from its exposed side surfaces to form a low refractive index layer 52 formed of air, thereby forming a lower DBR 50 as shown in FIG. 8F. Here, also, the KOH solution is used as an etchant.

Figure 8G:
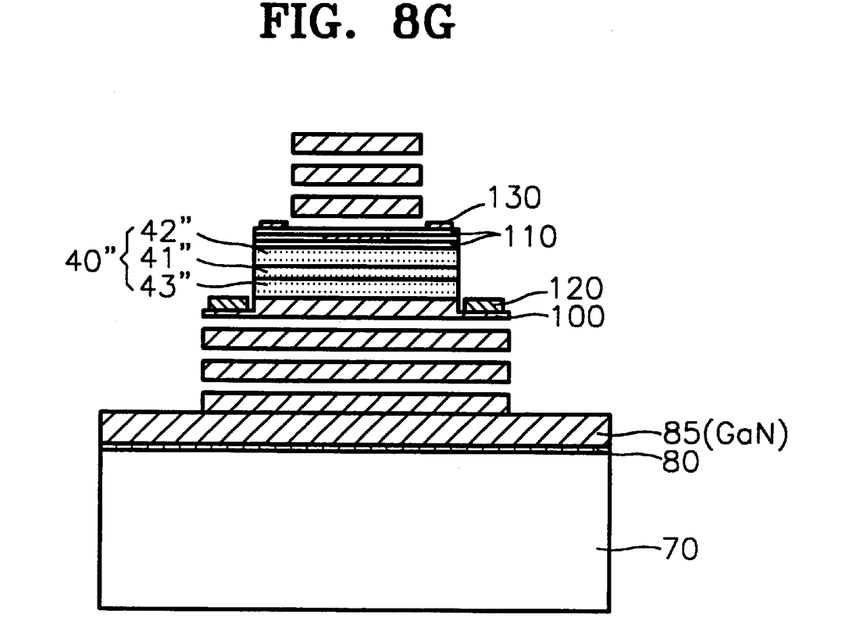

As shown in FIG. 8G, n-ohmic and p-ohmic contact metals 120 and 130 are deposited on the upper edges of the lower and upper contact layers 100 and 110, respectively, thereby completing the manufacture of the Group III-V complex VCSEL diode according to the present invention.

Alternatively, the DBR can be manufactured by stacking an $Al_xO_y$/GaN double layer as the upper and lower DBR layers and removing the $Al_xO_y$ layer using wet etching, to make the air layer a low refractive index layer, or by selectively removing a layer using photoelectrochemical (PEC) etching. For example, the DBR can be manufactured by stacking a p-GaN/n-GaN double layer as DBR layers using the fact that n-GaN is etched faster than p-GaN upon the PEC etching to remove the n-GaN layer using the PEC. Here, the p-GaN layers of the upper and lower DBRs are irrelevant to the flow of current since they are placed outside two electrodes, so that the p-GaN layers can be doped with p-type. Here, the dopant-selective etch characteristics of the PEC etching of GaN layer using Hg arc lamp illumination and the KOH solution are reinforced by electron-hole pairs generated from a semiconductor surface by light. These electron-hole pairs reinforce oxidization and reduction reactions in an electrochemical cell.

As described above, the Group III-V complex VCSEL diode according to the present invention can be used in a high capacity information storage apparatus since it can emit ultraviolet light of 400 nm wavelength and blue light, and performs single longitudinal mode operation in contrast with an edge emitting laser diode. In particular, the present invention can obtain a sufficient reflectance even with a small number of DBR pairs by forming distributed bragg reflectors (DBRs) including air layers. Thus, the crystal growth problem is solved, making the manufacture of the present invention easy. Also, current confinement and a waveguide are realized by the lateral oxidation or etching of AlN layers, thus obtaining a high quantum efficient operation and a single longitudinal mode.

What is claimed is:

1. A method of manufacturing a group III-V complex vertical cavity surface emitting laser diode, comprising the steps of:
    (a) sequentially growing a preliminary lower DBR layer which includes pairs of a lower refractive index material layer and a higher refractive index material layer having a refractive index higher than the lower refractive index material layer, a preliminary cavity layer and a preliminary upper DBR layer which includes pairs of a lower refractive index material layer and a higher refractive index material layer having a refractive index higher than the lower refractive index material layer, on a semiconductor substrate, wherein the preliminary lower and upper DBR layers are each formed of pairs of an $Al_xGa_{1-x}N$ layer and an $Al_yGa_{1-y}N$ layer when $0 \leq x < y \leq 1$;
    (b) forming an upper DBR layer by removing the lower refractive index material layers from the preliminary upper DBR layer using a selective etch method and forming air layers having a relatively low refractive index, wherein the lower refractive index material layers are $Al_yGa_{1-y}N$ layers;
    (c) forming a cavity by etching the preliminary cavity layer using a second etch method; and
    (d) forming a lower DBR layer by forming low refractive index layers of air by etching the lower refractive index material layers of the preliminary lower DBR layer from the side surface of the preliminary lower DBR layer using the selective etch method, wherein the lower refractive index material layers are $Al_yGa_{1-y}N$ layers.

2. A method of manufacturing a group III-V complex VCSEL diode, as claimed in claim 1, wherein in the steps of (b) and (d) the $Al_yGa_{1-y}$ N layer are respectively removed from the preliminary lower and upper DBR layers.

3. A method of manufacturing a group III-V complex VCSEL diode, as claimed in claim 1, further comprising a step of patterning the preliminary lower DBR layer by dry etching up to the upper surface of the substrate using a third dry etch method, after forming an etch mask, immediately after the step (c).

4. A method of manufacturing a group III-V complex VCSEL diode as claimed in claim 1, further comprising the step of forming a buffer layer by growing AlN or GaN directly on the semiconductor substrate, before the step (a).

5. A method of manufacturing a group III-V complex VCSEL diode as claimed in claim 4, wherein metal organic chemical vapor deposition (MOCVD) or molecular beam epitaxy (MBE) is used for crystal growth of the buffer layer.

6. A method of manufacturing a group III-V complex VCSEL diode as claimed in claim 1, wherein in the step (a), when $\lambda$ is the wavelength of light and n is the refractive index of a constituent material of a DBR, the upper and lower DBR layers are formed by alternately stacking GaN and AlN, or AlGaN with a relatively small amount of Al and AlGaN with a relatively great amount of Al, each of the four materials having a thickness of $\lambda/4n$.

7. A method of manufacturing a group III-V complex VCSEL diode as claimed in claim 6, wherein pairs of GaN and AlN, or pairs of AlGaN with a relatively small amount of Al and AlGaN with a relatively great amount of Al, are stacked to 2 or more pairs of stacked layers.

8. A method of manufacturing a Group III-V complex VCSEL diode as claimed in claim 1, wherein in the step (a), forming the preliminary cavity layer comprises the substeps of:
    forming an n-AlGaN carrier restrictive layer for restricting carriers, on the preliminary lower DBR layer;
    forming an active layer having a multi quantum well structure, of InGaN or GaN, on the n-AlGaN carrier restrictive layer; and
    forming a p-AlGaN carrier restrictive layer for restricting carriers, on the active layer.

9. A method of manufacturing a Group III-V complex VCSEL diode as claimed in claim 8, wherein the step of forming the n-AlGaN carrier restrictive layer further comprises the step of forming an n-AlN layer during the formation of the n-AlGaN carrier restrictive layer.

10. A method of manufacturing a Group III-V complex VCSEL diode as claimed in claim 8, wherein the step of forming the p-AlGaN carrier restrictive layer further comprises the step of forming a p-AlN layer during the formation of the p-AlGaN carrier restrictive layer.

11. A method of manufacturing a Group III-V complex VCSEL diode as claimed in claim 8, further comprising the step of:

forming n-GaN and p-GaN contact layers for metal contact on the lower surface of the n-AlGaN carrier restrictive layer and on the upper surface of the p-AlGaN carrier restrictive layer, respectively.

12. A method of manufacturing a Group III-V complex VCSEL diode as claimed in claim 11, wherein the step of forming the n-GaN contact layer further comprises the step of forming a n-AlN layer during the formation of the n-GaN contact layer.

13. A method of manufacturing a Group III-V complex VCSEL diode as claimed in claim 12, wherein the step of forming the p-AlGaN contact layer further comprises the step of forming a p-AlN layer during the formation of the p-AlGaN contact layer.

14. A method of manufacturing a Group III-V complex VCSEL diode as claimed in claim 1, wherein a KOH solution is used as an etchant for the selective etch method in step (b).

15. A method of manufacturing a Group III-V complex VCSEL diode as claimed in claim 9, further comprising the step of forming a current blocking layer by oxidizing or etching some of the width of the n-AlN layer from its side surface, after the step (c).

16. A method of manufacturing a Group III-V complex VCSEL diode as claimed in claim 10, further comprising the step of forming a current blocking layer by oxidizing or etching some of the width of the p-AlN layer from its side surface, after the step (c).

17. A method of manufacturing a Group III-V complex VCSEL diode as claimed in claim 12, further comprising the step of forming a current blocking layer by oxidizing or etching some of the width of the n-AlN layer from its side surface, after the step (c).

18. A method of manufacturing a Group III-V complex VCSEL diode as claimed in claim 13, further comprising the step of forming a current blocking layer by oxidizing or etching some of the width of the p-AlN layer from its side surface, after the step (c).

19. A method of manufacturing a Group III-V complex VCSEL diode as claimed in claim 14, wherein a KOH solution is used as an etchant for the selective wet etch method in step (d).

20. A method of manufacturing a Group III-V complex VCSEL diode as claimed in claim 10, further comprising the step of depositing a metal for use as an electrode on the edge upper surface of each of the n-GaN and p-GaN contact layers, after the step (d).

21. A method of manufacturing a Group III-V complex VCSEL diode as claimed in claim 1, wherein a pair of an $Al_xO_y$ layer and a GaN layer is stacked three to fifteen times to make each of the preliminary lower and upper DBR layers, in step (a), and the upper and lower DBRs each comprised of pairs of the GaN layer and an air layer are formed by removing the $Al_xO_y$ layer using the wet etch method, in steps (b) and (d), respectively.

22. A method of manufacturing a Group III-V complex VCSEL diode as claimed in claim 1, wherein a pair of a p-GaN layer and a n-GaN layer is stacked three to fifteen times to make each of the preliminary lower and upper DBRs, in step (a), and the upper and lower DBRs each comprised of pairs of the p-GaN layer and an air layer are formed by etching and removing only the n-GaN layer using a photoelectrochemical etch method, in steps (b) and (d), respectively.

23. A method of manufacturing a group III-V complex VCSEL diode, as claimed in claim 14, wherein in the steps of (b) and (d) the selective etch method is a wet etch method.

24. A method of manufacturing a group III-V complex VCSEL diode, as claimed in claim 14, wherein in the step of (c) the second etch method is a dry etch method.

25. The method according to claim 1, wherein the preliminary lower and upper DBR layers are not doped with n-type or p-type.

* * * * *